United States Patent
Simka et al.

(10) Patent No.: US 7,220,671 B2
(45) Date of Patent: May 22, 2007

(54) ORGANOMETALLIC PRECURSORS FOR THE CHEMICAL PHASE DEPOSITION OF METAL FILMS IN INTERCONNECT APPLICATIONS

(75) Inventors: Harsono Simka, Saratoga, CA (US); Juan Dominguez, Hillsboro, OR (US); Steven Johnston, Portland, OR (US); Adrien Lavoie, St. Hellens, OR (US); Kevin O'Brien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 108 days.

(21) Appl. No.: 11/096,860

(22) Filed: Mar. 31, 2005

(65) Prior Publication Data
US 2006/0223300 A1   Oct. 5, 2006

(51) Int. Cl.
*H01L 21/44* (2006.01)

(52) U.S. Cl. ...................... 438/680; 438/681; 438/475; 257/E21; 257/17; 257/319

(58) Field of Classification Search ................ 438/680, 438/681, 474, 475, 507, 513, 637, 643, 648, 438/650, 656, 677, 683, 685, 723, 724, 743, 438/744, 756, 757, 905, 954
See application file for complete search history.

(56) References Cited

U.S. PATENT DOCUMENTS

| | | | | |
|---|---|---|---|---|
| 5,998,870 A | * | 12/1999 | Lee et al. | 257/751 |
| 6,139,700 A | * | 10/2000 | Kang et al. | 204/192.17 |
| 6,482,262 B1 | * | 11/2002 | Elers et al. | 117/84 |
| 6,498,091 B1 | * | 12/2002 | Chen et al. | 438/627 |
| 6,767,582 B1 | * | 7/2004 | Elers | 427/253 |
| 7,049,226 B2 | * | 5/2006 | Chung et al. | 438/648 |

* cited by examiner

*Primary Examiner*—David Nhu
(74) *Attorney, Agent, or Firm*—Blakely, Sokoloff, Taylor & Zafman LLP

(57) ABSTRACT

Chemical phase deposition processes utilizing organometallic precursors to form thin films are herein described. The organometallic precursors may include a single metal center or multiple metal centers. The chemical phase deposition may be chemical vapor deposition (CVD), atomic layer deposition (ALD), or hybrid CVD and ALD. The use of these chemical phase deposition processes with the organometallic precursors allows for the conformal deposition of films within openings having widths of less than 100 nm and more particularly less than 50 nm to form thin films such as barrier layers, seed layers, and adhesion layers.

17 Claims, 6 Drawing Sheets

ORGANOMETALLIC PRECURSORS FOR THE CHEMICAL PHASE DEPOSITION OF METAL FILMS IN INTERCONNECT APPLICATIONS

BACKGROUND OF THE INVENTION

Field of the Invention

The present invention relates to the field of vapor phase deposition of metal films, and more particularly to the field of chemical vapor deposition and atomic layer deposition of metal films in interconnect applications.

The microelectronic device industry continues to scale down the dimensions of the structures within integrated circuits. Present semiconductor technology now permits single-ship microprocessor with many millions of transistors, operating at speeds of tens or even hundreds of millions of instructions per second. These transistors are generally connected to on another or to devices external to the microelectronic device by conductive traces and contacts through which electronic signals are sent or received. One process used to form contacts is known as a "damascene" process." In a typical damascene process, a photoresist material is patterned on a dielectric material and the dielectric material is etched through the photoresist material patterning to form an opening for a via or an interconnect line. The photoresist material is then removed (typically by an oxygen plasma) and a thin film such as an adhesion layer, a barrier layer, or a seed layer are deposited within the opening. The opening then filled, usually by deposition, with the conductive material (e.g, such as metal and metal alloys thereof.) A thin film such as an adhesion layer, barrier layer, or seed layer that is deposited within the hole may be formed by a physical vapor deposition (PVD) or by a sputtering process. But, as the widths of the openings in the dielectric layer are scaled down below 50 nm and as aspect ratios of the openings increase, it becomes difficult to conformally deposit the thin films by PVD or by sputtering. The ability to cover the sidewalls with the thin film using PVD in narrow openings is diminished and there may be excess overhang of the film. Similar problems result from sputtering the thin films within the openings. Additionally, it becomes difficult to deposit thin films having a thickness of less than 50 angstroms by PVD or sputtering. The thicker films that result from PVD or sputtering take up a greater percentage of the space within the openings and thus increase line resistance and reduce the RC delay.

DETAILED DESCRIPTION OF THE PRESENT INVENTION

Described herein are methods of chemical phase deposition utilizing organometallic precursors. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

Chemical phase deposition processes utilizing organometallic precursors to form thin films are herein described. The organometallic precursors may include a single metal center or multiple metal centers. The chemical phase deposition may be chemical vapor deposition (CVD), atomic layer deposition (ALD), or hybrid CVD and ALD, as well as plasma or ion enhanced CVD or ALD performed within a chemical phase deposition chamber. The use of these chemical phase deposition processes with the organometallic precursors allows for the conformal deposition of films having a thickness of less than 5 nm to 10 nm, and more particularly less than 50 angstroms, within openings having widths of less than 100 nm and more particularly less than 50 nm to form thin films such as barrier layers, seed layers, adhesion layers and metal gate electrodes. Additionally, the organometallic precursors may be deposited at temperatures of less than 400° C. with the chemical vapor deposition processes.

Figure 1A:
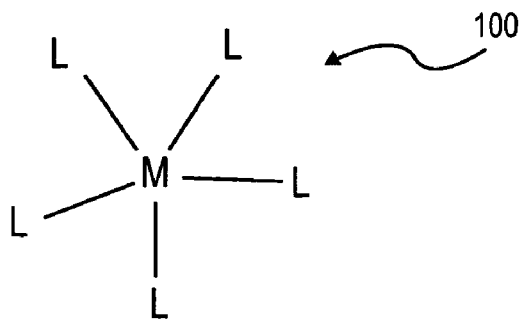
FIGS. 1a and 1b illustrate single metal center organometallic precursors.
Figure 1B:
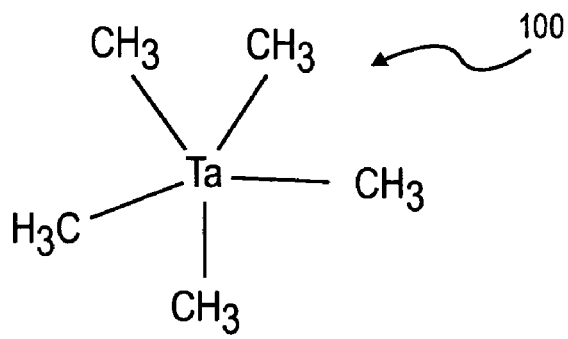

The organometallic precursors may be a single metal center compound or a multiple metal center compound. FIG. 1a illustrates a generic single metal center organometallic precursor 100. The metal M may be any type of metal that may be of use in forming thin films within integrated circuits. For example, for barrier layers the metal M may be (but is not limited to) refractory metals such as Ta, Ti, Re, Mo, Nb, W, Zr, Hf or Co. The metal M for a seed layer may be (but is not limited to) Cu, Ru, Pd, Pt, Ir, or Ni. An adhesion layer to increase the adhesion between a barrier layer and a seed layer may be a non-reactive noble metal such as Pt or Pd. The number of the ligands L depends on the number of binding sites, the coordination number, and the valence of the metal M. FIG. 1a illustrates a metal M to which five ligands L may be bound. At least one of the ligands is an organic compound. FIG. 1b illustrates a particular example of a single metal center compound 100 where the metal M is tantalum (Ta) and the ligands are methyl groups ($CH_3$). The ligands L may be hydrogen, an alkyl, an allyl, an aryl, a silyl, a carbonyl, a polycyclic aryl, an amine, an alkoxide, a siloxyl, a phosphine, a polycyclic, or a heteronuclear polycyclic where at least one of the ligands of the compound is organic. The ligands on the organometallic precursor may be selected to increase the thermal stability of the precursor so that it may be deposited at temperatures within the back-end-of-the-line (post-metallization) thermal budget, for example lower than 400° C. Long chained alkyls, allyls, aryls, and silyls may increase the stability of the organometallic precursor. The ligand L may also be selected to tailor the reactivity of the organometallic precursor. The reactivity may be tailored by selecting the chemical group(s), bonding configuration (such as monopodal, chelated, etc.), constituent bond energies, and molecular weight of the ligand. Certain elements such as F-based ligand are commonly used for making compounds more volatile and/or reactive. Methyls (or alkyls) or carbonyls directly bound to the metal can make the compounds more reactive. The ligands may also be selected to increase the rate of deposition, the quality of the film deposited, the conformality of the film deposited, and the smoothness of the film. Those of ordinary skill in the art would be familiar with the types of ligands that may affect these properties.

Figure 1C:
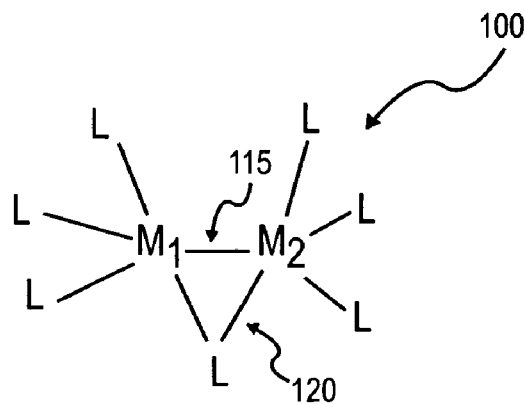
FIGS. 1c–1e illustrate multiple metal center organometallic precursors.
Figure 1D:
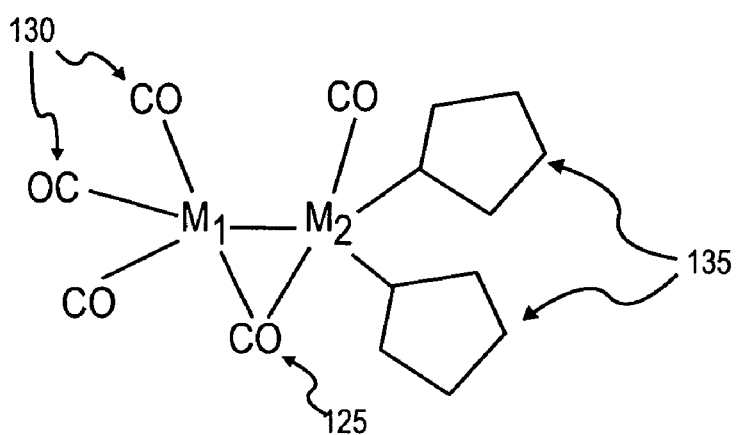
Figure 1E:
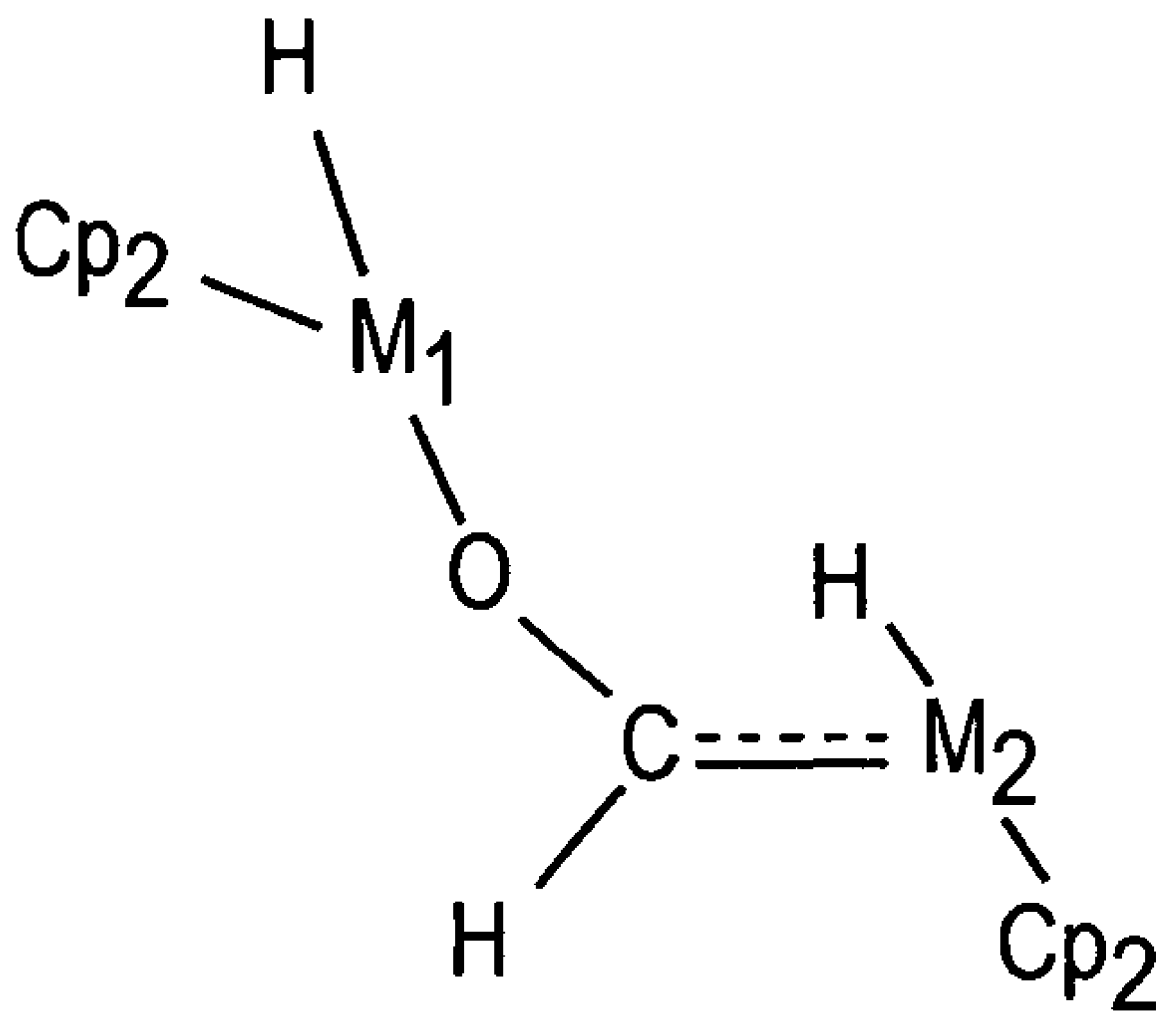

The organometallic precursor may also have multiple metal centers. An organometallic precursor having multiple metal centers has at least two metal centers. FIGS. 1c–1e illustrate examples of multiple metal center organometallic precursors having two metal centers. FIG. 1c illustrates a generic bridged dinuclear compound 110 with a first metal center M1, a second metal center M2, and ligands L. The first metal center M1 and the second metal center M2 are directly bound to one another through a direct bond 115 and are also bound through a bridging ligand 120. A commonly found example of a bridged dinuclear compound 110 is a carbonyl bridge 125 between the first metal center M1 and the second metal center M2 and carbonyl ligands 130 and polycyclic ligands 135. FIG. 1e illustrates an example of a compound where the first metal center M1 and the second metal center M2 are not directly bonded.

The first metal center M1 and the second metal center M2 may be of identical or non-identical elements. In an embodiment where the multiple metal centers are different elements that metal centers may be elements having the same properties such as barrier layer properties, seed layer properties, or adhesion layer properties. For example, the metal centers may both be a barrier layer metal where the first metal center M1 may be a first barrier layer metal and the second metal center M2 may be a second barrier layer metal. Or, in another embodiment the metal centers may both be seed layer metals where the first metal center may be a first seed layer metal and the second metal center M2 is may be a second seed layer metal. In an alternate embodiment the metals centers may also both be adhesion metals. The metals centers may also be a combination of the different types of metals having different properties. For example, in one embodiment the first metal center may be barrier layer metal and the second metal center may be a seed layer metal. The multiple metal centers may be any combination of metals having different properties such as barrier layer metals, seed layer metals, and adhesion layer metals to form alloyed thin films. The use of an organometallic precursor having multiple metal centers is valuable because it allows for the use of a single precursor to deposit an alloy film composed of two or more metals.

The chemical phase deposition process may be chemical vapor deposition (CVD), atomic layer deposition (ALD), or hybrid CVD/ALD process. The organometallic precursors in these methods may be liquid, solid or gaseous precursors delivered within a solution or carried by an inert gas or directly fed at any concentration to the surface on which the film is to be deposited. The metal film is formed by the organometallic precursor independently or in combination with a co-reactant. The co-reactant serves to reduce the organometallic precursor to provide metallic binding sites where the metal film may be built up. The co-reactants that can be used for deposition of the organometallic precursor include, but are not limited to, hydrogen atoms or molecules, oxygen atoms or molecules, ozone, ammonia, amines, hydrazines, allyl amines, silane, methane, germane, carbon monoxide, ethanol, diborane, metal hydrides, as well as other reactive metal precursors such as $ZnEt_2$. The co-reactants for these depositions can also be utilized to obtain light element incorporation into the film. As a result the metal combinations and alloys could result in nitrides, silicides, carbides, borides, phosphates and combination thereof.

A thin metal film is formed by chemical vapor deposition (CVD) by the decomposition and/or surface reactions of the metal precursor. The gaseous compounds of the materials to be deposited are transported to a substrate surface where a thermal reaction/deposition occurs. Reaction byproducts are then exhausted out of the system. In an embodiment of the current invention, the organometallic precursor or precursors are introduced into a CVD reaction chamber along with a co-reactant so that both the organometallic precursor and the co-reactant are present within the chamber at the same time. The thin metal film is then formed on the substrate in a single deposition step. The growth of the thin metal film may stop by the consumption of the organometallic precursor and co-reactant present within the chamber or by purging the chamber of the gases. By this method the thickness of the thin metal film may be controlled.

Atomic layer deposition (ALD) grows a film layer by layer by exposing a substrate to alternating pulses of the organometallic precursor or precursors and the co-reactant, where each pulse may include a self-limiting reaction and results in a controlled deposition of a film. A growth cycle for a monolayer of the metal film is two pulses, one pulse of the organometallic precursor and one pulse of the co-reactant, each pulse being separated by an inert gas purge of the reaction chamber to remove compounds and reaction intermediate existing in the chamber. Pulse and purge duration lengths are arbitrary and depend on the intended film properties. For example, a single pulse of the organometallic precursor would typically form an adsorbed layer of the metal and/or its ligands. The single pulse of the organometallic precursor would be followed by a pulse of the co-reactant that would activate this adsorbed layer by reacting with and removing ligands from the surface, and regenerate active surface reaction sites. A single monolayer of the metallic film would be formed after the pulse of the co-reactant. The film growth cycle may be repeated as many times as necessary to achieve a predetermined film thickness. In one embodiment, a single metal center organometallic precursor may be in alternated pulses with a co-reactant to form a thin metal film. In another embodiment, a multiple metal center organometallic precursor may be in alternated pulses with a co-reactant to form an alloyed or composite metal film. Alloyed or composite films may also be formed by ALD by using more than one organometallic precursor. In one embodiment, the alloyed or composite film may be formed by pulsing an organometallic precursor in a first pulse, purging the reaction chamber, pulsing a co-reactant in a second pulse after the first pulse, purging the reaction chamber, and then pulsing a second organometallic precursor in a third pulse after the second pulse. In another embodiment, the alloyed or composite film may be formed by pulsing a first organometallic precursor and a second organometallic precursor concurrently during a first pulse and pulsing a co-reactant in a second pulse after the first pulse. The organometallic precursors used to form the alloyed or composite film may be single metal center organometallic precursors, multiple metal center organometallic precursors, or a combination of single and multiple metal center organometallic precursors. In theory, each deposited layer formed by this process is defect free. Atomic layer deposition is valuable because it forms the thin metal film to a specified thickness and may conformally coat the topography of the substrate on which it forms the thin metal film.

Figure 2A:
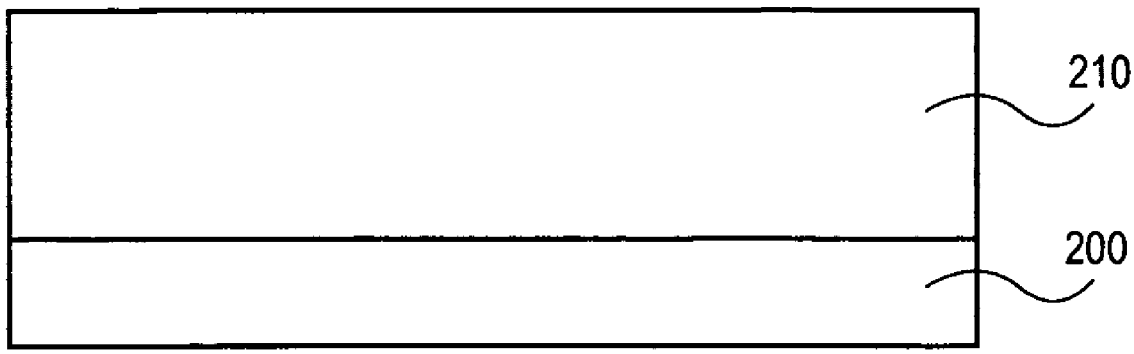
FIGS. 2a–2i illustrate the formation of interconnects utilizing organometallic precursors to form thin films within the interconnects.

In an embodiment, the thin films formed by a chemical phase deposition process utilizing organometallic precursors may be deposited within openings in a dielectric layer to form a barrier layer, a seed layer, or an adhesion layer for vias or interconnect lines in an integrated circuit. In FIG. 2a, a substrate 200 is provided. Substrate 200 may be any surface generated when making an integrated circuit upon which a conductive layer may be formed. In this particular embodiment the substrate 200 may be a semiconductor such as silicon, germanium, gallium arsenide, silicon-on-insulator or silicon on sapphire. A dielectric layer 210 is formed on top of substrate 200. Dielectric layer 210 may be an inorganic material such as silicon dioxide or carbon doped oxide (CDO) or a polymeric low dielectric constant material such as poly(norbornene) such as those sold under the tradename UNITY™, distributed by Promerus, LLC; polyarylene-based dielectrics such as those sold under the tradenames "SiLK™" and "GX-3™", distributed by Dow chemical Corporation and Honeywell Corporation, respectively; and poly(aryl ether)-based materials such as that sold under the tradename "FLARE™", distributed by Honeywell Corporation. The dielectric layer 210 may have a thickness in the approximate range of 2,000 and 20,000 angstroms.

Figure 2B:
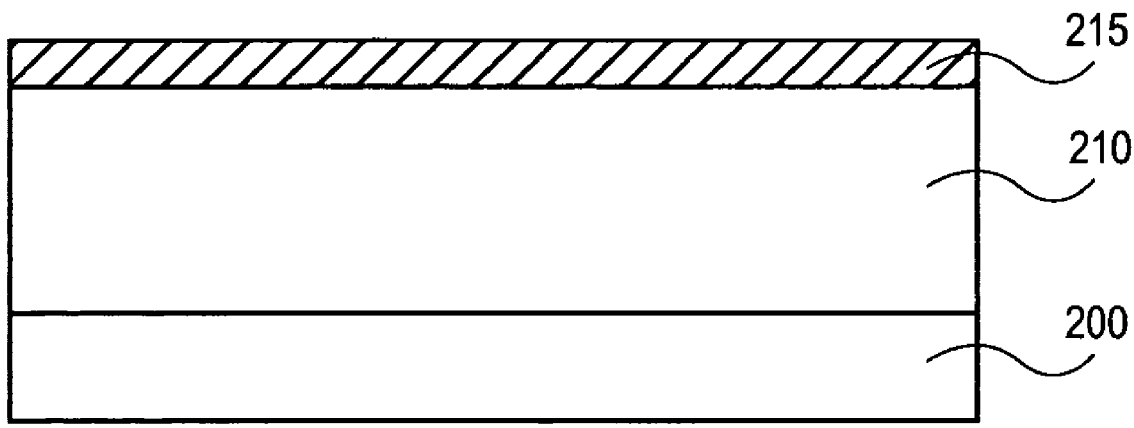

In FIG. 2b, after forming the dielectric layer 210, a bottom anti-reflective coating (BARC) 215 may be formed over the dielectric layer 210. In embodiments where non-light lithography radiation is used a BARC 215 may not be necessary. The BARC 215 is formed from an anti-reflective material that includes a radiation absorbing additive, typically in the form of a dye. The BARC 215 may serve to minimize or eliminate any coherent light from re-entering the photoresist 220, which is formed over the BARC 215 in FIG. 2c, during irradiation and patterning of the photoresist 220. The BARC 215 may be formed of a base material and an absorbant dye or pigment. In one embodiment, the base material may be an organic material, such as a polymer, capable of being patterned by etching or by irradiation and developing, like a photoresist. In another embodiment, the BARC 215 base material may be an inorganic material such as silicon dioxide, silicon nitride, and silicon oxynitride. The dye may be an organic or inorganic dye that absorbs light that is used during the exposure step of the photolithographic process.

Figure 2C:
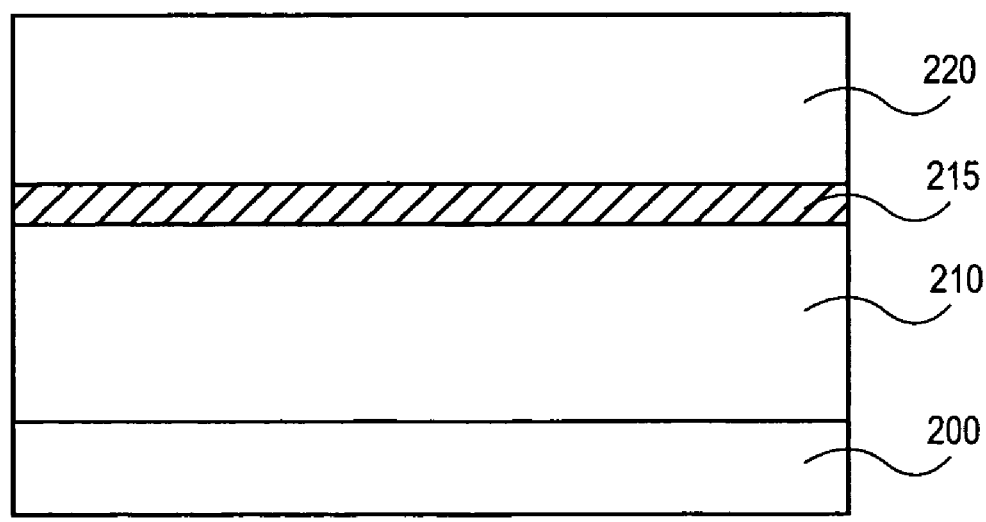
Figure 2D:
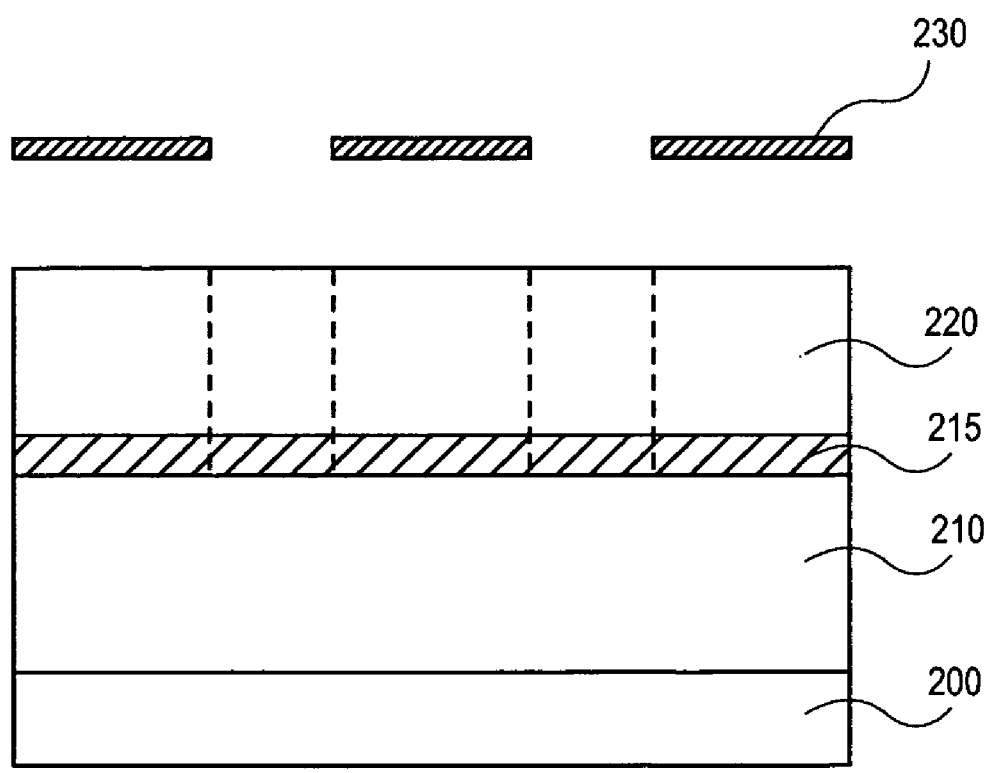
Figure 2E:
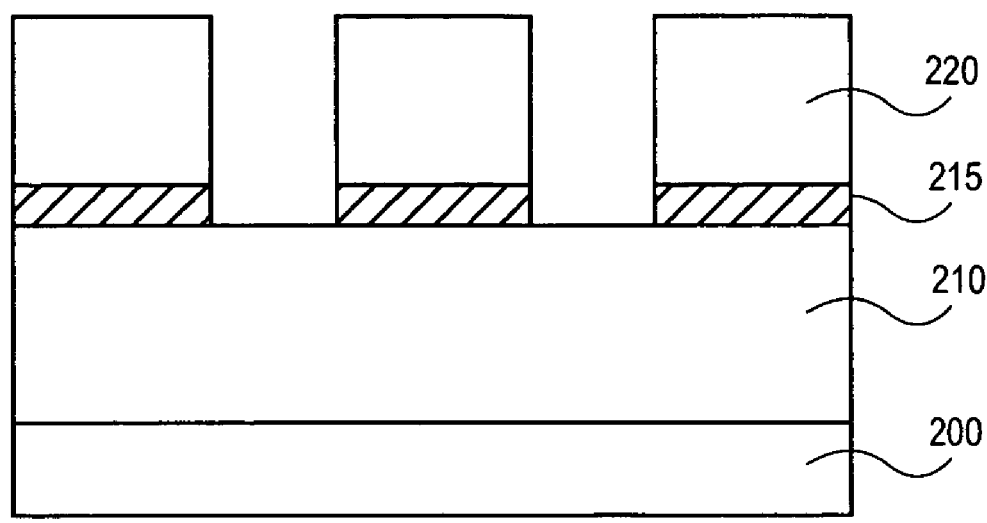
Figure 2F:
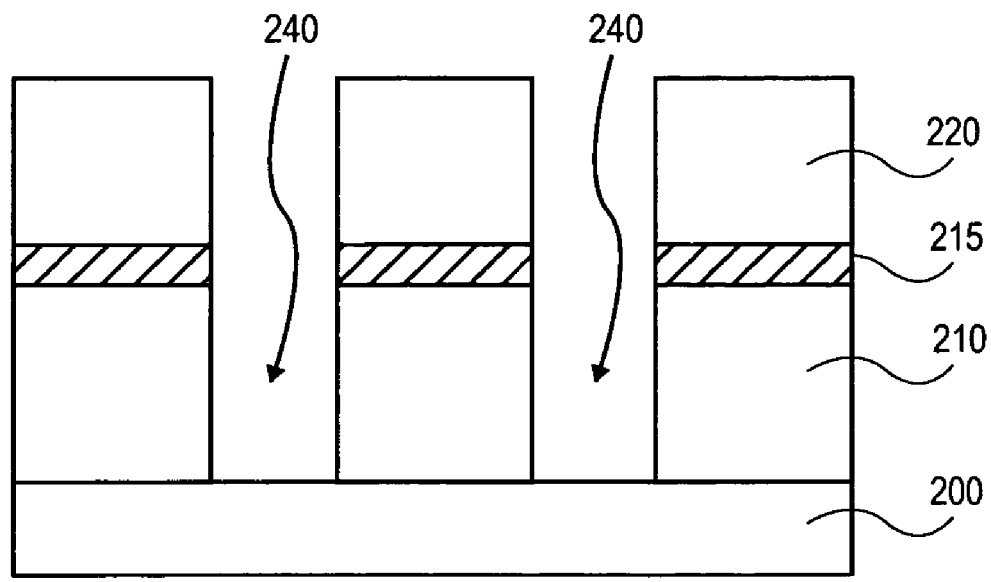
Figure 2G:
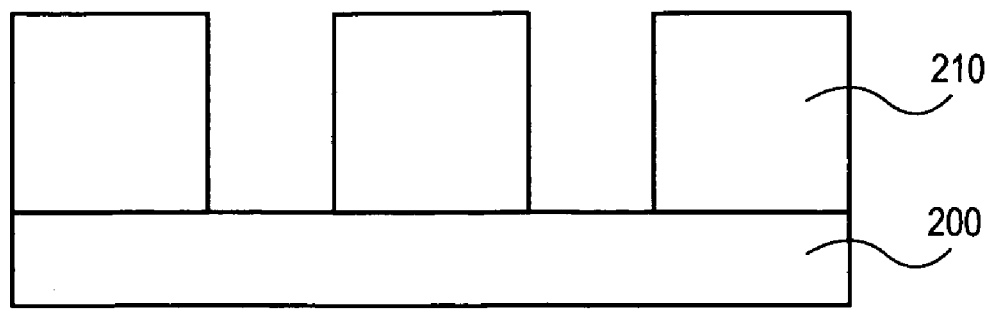

In FIG. 2c a photoresist 220 is formed over the BARC 215. The photoresist 220, in this particular embodiment, is a positive resist. In a positive tone photoresist the area exposed to the radiation will define the area where the photoresist will be removed. As illustrated in FIG. 2d, a mask 230 is formed over the photoresist 220. In FIG. 2e, the photoresist 220 and the BARC 215 are patterned by exposing the masked layer to radiation. A developer solution is then applied to the photoresist and the irradiated regions 225 of the photoresist 220 that were irradiated may be solvated by the solution.

Figure 2H:
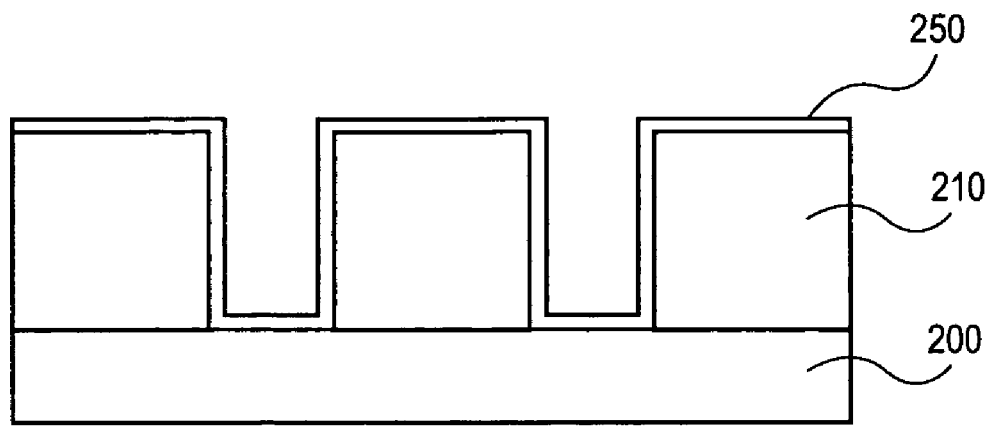
Figure 2I:
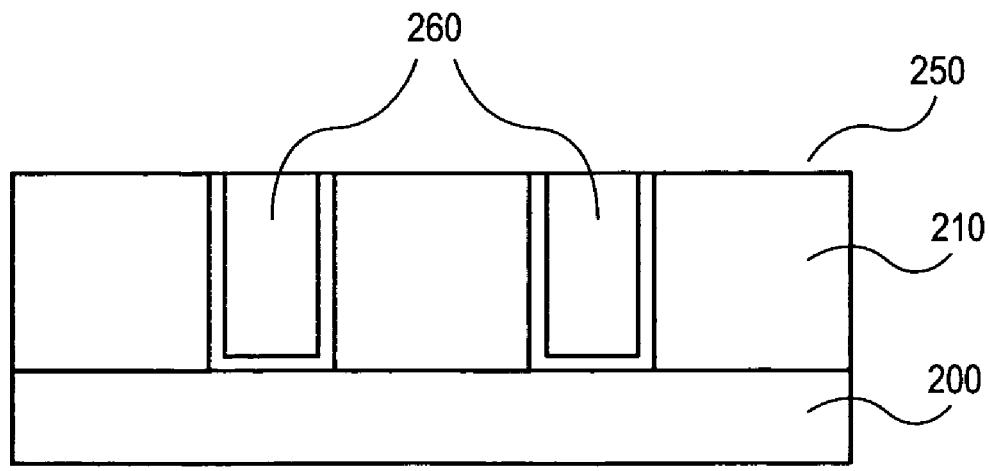

After the photoresist 220 is developed and removed, vias 240 are etched through dielectric layer 210 down to substrate 200, as illustrated in FIG. 2h. Conventional process steps for etching through a dielectric layer 210 may be used to etch the via, e.g., a conventional anisotropic dry etch process. When silicon dioxide is used to form dielectric layer 210, the vias 240 may be etched using a medium density magnetically enhanced reactive ion etching system ("MERIE" system) using fluorocarbon chemistry. When a polymer is used to form dielectric layer 210, a forming gas chemistry, e.g., one including nitrogen and either hydrogen or oxygen, may be used to etch the polymer. The aspect ratios of the height to the width of the vias 240 may be in the approximate range of 10:1 and 20:1. The openings of the vias 240 may be less than approximately 100 nm (nanometers) wide or more particularly less than approximately 50 nm wide. After vias 240 are formed through dielectric layer 210, the photoresist 220 and the BARC 215 are removed. Photoresist 220 and BARC 215 may be removed using a conventional ashing procedure as illustrated in FIG. 2i.

A thin metal film 250 is then conformally formed over the vias 240 and the dielectric 210 as illustrated in FIG. 2j by a chemical phase deposition process utilizing an organometallic precursor as described above. As described above, the organometallic precursor may have a single metal center or multiple metal centers and may be utilized in a chemical vapor deposition (CVD) process or an atomic layer deposition (ALD) process. These processes may form thin conformal films and films that are amorphous or polycrystalline. This thin metal film 250 may serve as a barrier layer, a seed layer, an adhesion layer, or a combination of any of these types of films. The thin metal film 250 may have a thickness in the approximate range of 5 Å and 300 Å and more particularly a thickness of less than 50 Å. The purpose of a barrier layer is to prevent metals such as copper that expand at temperatures used in semiconductor processing from diffusing out of the vias and interconnect lines and causing shorts. The formation of an amorphous or microcrystalline film is valuable in forming a barrier layer, and embodiments of the current invention cover the formation of polycrystalline or amorphous metals. A seed layer has catalyzing properties and provides a seed for the deposition of the bulk metal within the vias 240 by electroplating or electroless plating. In an embodiment, the barrier layer may also serve as the seed layer. An adhesion layer may improve the adhesion of the thin metal film 250 to the dielectric layer 210 or to another metal. The deposition of a thin metal film 250 that has the properties of a barrier layer, a seed layer, or an adhesion layer may be formed by performing a chemical phase deposition process with an organometallic precursor that includes a metal or metals having those properties. The thin metal film 250 may also be formed as an alloy or composite having any combination of these properties or as an alloy of different metallic elements having the same properties.

In an embodiment, a thin metal film 250 formed of a single metallic element may be formed by using an organometallic precursor having a single metal center and any of the ligands listed above. For example, the single metal center organometallic compound may be a cyclopentadienyl (Cp), an arene, a carbonyl, a mixed dimer, an alkyl, an aryl, a benzyl, or an alkylidene. The metal may be a barrier metal, a seed layer metal, or an adhesion metal. Examples of barrier metals include Ta (tantalum), Ti (titanium), Re (rhenium), Mo (molybdenum), W (tungsten), Zr (zirconium), Hf (halfnium), Co (cobalt), Nb (niobium) and other analogous refractory metal compounds from groups VIB, VIIB, and VIII in the periodic table. Examples of seed layer metals include Cu (copper), Ru (ruthenium), Pd (palladium), Pt (platinum), Ir (iridium), Ni (nickel), and other similar metallic elements from the same groups on the periodic table. Specific examples of single metal center organometallic precursors that have Ru (ruthenium), a seed metal, as the single metal center include the cyclopentadienyl compounds $CPRuCO_2^-$, $CPRuRCO_2$ (R=H or Me), $Cp_2Ru$, $Cp_2Ru^+$, $Cp_2Ru^-$, $(Me_2Cp)_2Ru$, $CpRu(benzene)^+$, $[CpRu(CO)_2]_2$, the arene compounds $(\{arene\}RuCl)_2$, $[benzeneRu(OH_2)_3]_2^+$, $(Me_6benzene)Ru(ethane)_2$, $\{COD\}Ru(benzene)$, the carbonyl compounds $Ru_3(CO)_{12}$, $(Ru(CO)_4)_2^-$, $Ru(CO)_2(thd)$, $RuCO_5$, $(acrylonitrile)Ru(CO)_4$, $(C_4H_4)Ru(CO)_4$, (butene) $Ru(CO)_3$, $(allyl)_2TaRu(CO)_2$, $(COD)_2Ru(CO)$, and other compounds such as $Ru(C_7H_9)_2$, $RuO_2$, $RuO_4$, $\{COD\}Ru(allyl)_2$, $Ru(acac)_3$, $Ru(thd)_3$, $(norbornene)Ru(allyl)_2$, $(norbornene)Ru(cycloheptenyl)$, $L(PR_3)Cl_2Ru=CHY$, and $(L_2)(CO)RuCl(C^-Ph)$. Specific examples of single metal center organometallic precursors that have Cu (copper), a seed metal, as the single metal center include the cyclopentadienyl compounds $CpCu(CNMe)$, $CpCu(CNCMe_3)$, $CP^*CuCO$, $CpCuPR_3$ (R=Et or Ph), $CpCu(CSiMe_3)_2$, the alkyl or aryl compounds $MeCu(PPh_3)_3$, $CuMe$, $CuCCH$ (ethynylcopper), $CuCMe_3$ (methylacetylidecopper), $(H_2C=CMeCC)Cu$ (3-methyl-3-buten-1-ynylcopper), $(MCH_2CH_2CC)Cu$ (1-pentynylcopper), $CuCCPh$, $C_6H_5Cu$ (phenyl copper), $(Me)_3CCCCu$ (3,3-dimethyl-1-butynyl) copper, $(H_3CCH=CH)_2CuLi$, $Me_3SiCCCH_2Cu$, and other compounds such as $CuCN$, $[Cu(OAc)]n$, $Cu_2Cl_2(butadiene)$, $\mu$-[(trimethylsilyl)methyl]copper, $C_7H_7CuO$ (2-methoxyphenylcopper), $([COD]CuCl)_2$, $(MeCN)_4Cu^+$, $Me_3SiOCu(Pme_3)_3$, $Cu(C_4H_4S)$, and Cu-carbene compounds e.g. those that are imidazolium-derived. Specific examples of single metal center organometallic precursors that have Ta (tantalum), a seed metal, as the single metal center include the cyclopentadienyl compounds $[Na(diglyme)_2][Ta(CO)_6]$, $CpTa(CO)_4$, $CpTa(CO)_4$, $(MeCp)Ta(CO)_4$, $CpTa(CO)_3(R)$, where $R=PPh_3$ or $AsPh_3$, $Cp_2TaH_3$, $CpTa(CO)_3(R)$, where $R=THF$, $PPh_3$, or $PCy_3$, $CpTa(CO)_2(C_5H_6)$, $Cp_2TaH(CO)$, $Cp_2TaR(CO)$ where $R=Me$, $CH_2Ph$, or Ph, $[Cp_3Ta_3(CO)_7]$, $[Cp_2TaH(CH_2=CHR')]$, $[Cp_2Ta(CH_2CH_2R')(CNR)]$, $CpTaXMe(CHCMe_3)]$ where X=Cl or Me, $[Cp'TaX(CH_2Ph)(CHPh)]$ where $Cp'=C_5H_4Me$, $C_5Me_5$ and X=Cl or $CH_2Ph$, $Cp^*Ta(PMe_3)(C_2H_4)(CHCMe_3)$, $[Cp_2TaMe(CH_2)]$, $[Cp(MeCp)TaMe(CH_2)]$, $[Cp_2TaMe(CHR)]$, where R=H, Me, Ph, or $SiMe_3$, $[Cp_2Ta(CHPh_2)(CHCMe_3)]$, $[Cp_2Ta(CH_2Ph)(CHPh)]$, $Cp^*TaMe_3Ph$, $Cp^*TaMe_2(Me_2CO)$, $Cp^*TaMe_2(C_6H_4)$, $Cp_2TaMe_3$, $(Cp_2TaMe_2)^+$, $(Cp_2Ta(CH_2SiMe_3)_2)^+$, $Cp_2TaPh_2$, $Cp^*TaMe_4$, $Cp_2Ta(CP)_2$, $Cp'Me_2Ta(indanyl$ or other metalacycle, $Cp_2TH(CH_2=CHR)$ where R=Me, Et, or Prn, $Cp_2Ta(cyclopentene)$, $Cp_2Ta(benzyl)(CHPh)$, $Cp_2ClTaCH(tBu)$, $CpTa(CH(tBu)X(PMe_3)_2$, $Cp_2TaMe(C_2H_4)$, $CH_2=Ta(Cp)_2CH_3$, $Cp_2TaPrn(C_8H_8)$, $CpTa(CO)_x(PhCCPh)$ where x=1 or 2, $Cp_2Ta(allyl)$, $Cp_2M(methallyl)$, $Cp'TaH_3$, $CpTaCO_4$, $Cp_2TaH(CO)$, $Cp_2Ta(allyl)$, $Cp_2TaH$ (propene), $Cp_2TaMe_3$, $Cp^*TaCO_4$, $Cp^*TaMe_4$, $Cp_2(Prn)(CNMe)$, $Cp^*TaMe_2(benzene)$, $Cp^*Ta(=CHCMe_3)(ethane)PMe_3$. The single metal center may also be a Ta carbonyl compound such as $Ta(CO)_3(C_7H_7)$, $[Ta(CO)_6]^-$, $[Ta(CO)_6]$, $Ta_2(CO)_{12}$, $Ta(CO)_5(Py)^-$, $Ta(CO)_2(dmpe)_2$, $TaX(CO)_2[Me_2P(CH_2)_2PR_2]_2$ where X=Cl or I and R=Et or iPr, $(RHg)Ta(CO)_x$ where R=Et or Ph, $Ph_3SnTa(CO)_6$, $[(C_5H_4Bu)Ta(CO)_3\{Si(C_{18}H_{37})_2\}]_2$, and $[Na(diglyme)_2][Ta(CO)_6]$, or allyl compounds such as $Ta(allyl)_4$, $Ta(1$-methylallyl$)(C_4H_6)_6$, alkyl, benzyl, or aryl compounds such as $TaMe_5$, $Ta(CH_2Ph)_5$, $TaMe_3(CH_2SiMe_3)_2$, $(TaMe_7)_2^-$, $(TaPh_6)_3^-$, $(TaPh_6)_4^-$, $[TaR_6]^-$ where R=Ph or p-tolyl, $[TaMe_3(C_8H_8)]$, $TaMe(C_8H_8)(C_8H_8)$, $TaCl_2Me(C_8H_8)$, $TaMe(C_8H_8)(C_8H_8)$, $TaCl_2Me[C(Me)=NR]_2$ where R=Cy or p-Tol, $[Ta(CH_2SiMe_3)\{N(SiMe_3)_2\}_2(CHSiMe_3)]$, and $[Ta(CH_2SiMe_3)_2]_2(mu-CsiMe_3)_2$, or alkylidene compounds such as $[(Me_3CO)_3Ta[CHC(Me)_3]$, $[Ta(OtBu)_3(CHCMe_3)]$, $[TaXL_2(CHCMe_3)_2$ where X=Cl, Me, Np and $L=PMe_3$ or $PMe_2Ph$, $[\{TaX(PMe_3)\}_2(\mu-N_2)]$ where X=Cl, Me or Np, $Ta(mesityl)(CHCMe_3)_2(PMe_3)_2$, $[Cp_2TaMe(CH_2)]$, $[Cp(MeCp)TaMe(CH_2)]$, $CpTaC(CMe_3)(Cl)(PMe_3)_3$, and $Ta(CH_2CMe_3)_3(CHCMe_3)$ and other Ta single metal center organometallic compounds such as complexes of the type: $TaXR_4$, $TaX_2R_3$, $TaX_3R_2$, $TaX_4R$ including metallacyclic compounds.

The thin metal film 250 may be formed of one metallic element through the use of one single metal center organometallic precursor. In this embodiment, any of the single metal center organometallic precursors listed above may be deposited in combination with a co-reactant by either CVD or ALD. More than one single metal center organometallic precursor may also be employed to deposit an alloy or a composite with more than one metallic element. Precursors with the same metal centers but with different ligands may be used to deposit films with different impurities and/or dopant concentrations (such as C, N, or O), leading to controlled, non-uniform film properties. This may allow deposition of a film with graded composition and tailored properties. Two different precursors with the same metal center may also be used as co-reactants for deposition of a film. Another potential use of two different precursors with the same metal center is to allow changing the film deposition rate rapidly, by switching gas flow from one stream to another gas stream containing metal precursor with the same metal center but with different ligands that have different surface reactivities than the previous organometallic precursor. This allows changing the deposition rate without having to change the deposition temperature, which may be difficult to do rapidly. An alloyed thin metal film 250 may be formed by CVD by combining two or more single metal center organometallic precursors in a CVD chamber along with a co-reactant. An alloyed or graded composite thin metal film 250 may be formed by ALD in one embodiment by introducing a first single metal center organometallic precursor and introducing a second single metal center organometallic precursor into the chamber in different pulses, alternating each single metal center organometallic precursor with a co-reactant. For example, in a first pulse a first organometallic precursor is introduced into the chamber, the chamber is then purged and a co-reactant is introduced in a second pulse, the chamber is purged, a second organometallic precursor is introduced into the chamber, the chamber is purged, and the co-reactant is introduced. This sequence may be repeated until the target thickness of the film is achieved. An alloyed thin metal film 250 may also be formed by ALD by introducing more than one single metal center organometallic precursor in one pulse in alternating pulses with a co-reactant. In yet another embodiment, a thin metal film 250 having a concentration gradient of at least two different metals may be formed using more than one single metal center organometallic precursor. Furthermore, a plasma pulse may be used in any of the precursor or co-reactants steps to obtain changes in composition, deposition rate, or another functional property. The temperature of the substrate during either CVD or ALD may be in the approximate range of 25° C. and 400° C. and more particularly 100° C. and 400° C. The ability to deposit the thin metal film 250 at temperatures of less than 400° C. is valuable because the chemical phase deposition processes may be used with post-metallization substrates that cannot withstand higher temperatures.

In another embodiment, an alloyed thin metal film 250 may be formed by an organometallic precursor having multiple metal centers. In one embodiment, the organometallic precursor having multiple metal centers may have a combination of diffusion barrier metals such as Ta (tantalum), Ti (titanium), Re (rhenium), Mo (molybdenum), W (tungsten), Zr (zirconium), Hf (halfnium), Co (cobalt), Nb (niobium) and other analogous refractory metal compounds from groups VIB, VIIB, and VIII in the periodic table. Examples of these organometallic precursors having two metal centers include $Cp_2(CO)Nb(u-Co)Co(CO_3)$, $Cp_2Nb$ (μ-CO)$_2$Mo(CO)Cp, MoW(Co)$_6$Cp$_2$, MoCo(CO)$_7$Cp, and TiMo(CO)$_3$(Cp)$_3$. The metals within these exemplary compounds may be replaced with another metal from the same group on the periodic table and having the same properties. There are other types of organometallic precursors having multiple metal centers where the fraction of the different metal centers is fixed by the ligands, potentially resulting in alloyed films with fixed metal ratios. Examples of these types of molecules are carbonyl and cyclopentadiene (Cp) based compounds such as TiCo[OCCo$_3$(CO)$_9$]$_2$(CO)$_4$Cp and oligomers such as Ta$_5$MoCl$_{18}$. Another example of an organometallic precursor having two metal centers of different barrier metals is Cp$_2$NbR(CHOZrHCp$_2$) where R can be any alkyl, H, or phosphine and the two metal centers are not directly bonded to one another (like the compound illustrated in FIG. 2e.) In another embodiment, the multiple metal centers may be different metals that both have seed layer properties. Metals having seed layer properties include, for example, Cu (copper), Ru (ruthenium), Pd (palladium), Pt (platinum), Ir (iridium), and Ni (nickel). Examples of such compounds include Ru$_3$Co(CO)$_{13}$, IrCu-ClCOPPh$_3$(MeN$_3$Me), CpRu(C$_5$H$_4$)CW(CO)$_4$Br, and (Et$_2$N)$_3$Ti—Cp—Ru—Cp—Ti(NEt$_2$)$_x$, x=2 or 3. An alloyed thin metal film 250 may be formed with a multiple metal center organometallic precursor by CVD or by ALD. Multiple metal center organometallic precursors are valuable because alloyed films may be formed by utilizing one precursor that reduces the complexity of the deposition processes. Although, more than one organometallic precursor may be used to deposit alloyed films containing greater numbers of metallic elements or a film having a concentration gradient of different metallic elements.

An alloyed thin metal film 250, in one embodiment, may be formed of at least two different metals where one metal has barrier layer properties and the other metal has seed layer properties. Refractory metals that may serve as the barrier metal and catalyst metals that may serve as the seed metal are listed above. Multiple metal center organometallic precursors containing both a barrier metal and a seed layer metal include carbonyl bridged and oligomeric compounds such as TiCu(μ-SMe$_2$)Cl(Cp$_2$), TaAu(CO)$_5$CO(PPh$_3$), MoPt (CO)$_3$[CN(t-butyl)]$_2$Cp, W$_2$Cu(CO)$_6$Cp, WRu$_3$H(CO)$_{12}$Cp.

Co-reactants may also be utilized to incorporate other elements such as carbon, nitrogen, oxygen, silicon, aluminum, boron, phosphorous, arsenic, and/or tin into the thin metal film 250. In one embodiment, the co-reactants may be used to obtain carbon incorporation into a barrier layer film. Carbon increases the amorphous characteristics of the barrier layer film and also serves to fill in grain boundaries to prevent the diffusion of copper through the film. The amount of carbon incorporated into the film may be in the approximate range of a trace amount to 70% of the film by weight or more particularly in the approximate range of a 1% to 30% of the film by weight. Carbon-containing co-reactants may add carbon dopants to the film in a controlled manner using CVD or ALD. It is valuable to control the amount of carbon added to a barrier layer film because too much may increase the resistance of the film too much and too little may not provide sufficient barrier properties to the film. Carbon-containing co-reactants that may serve this purpose include any compound containing carbon. The carbon content of the films may be accurately controlled through the use of ALD. In one embodiment, the organometallic precursor and a carbon-containing co-reactant are alternately pulsed. The second pulse that includes the carbon-containing co-reactant directly modifies each deposited precursor monolayer. The amount of carbon that is deposited may be tailored by either selecting appropriate process conditions (e.g. temperature, pressure, flow rates, concentrations, etc.) or by plasma enhancing the CVD or ALD process. The choice of carbon-containing co-reactant may increase the carbon content by choosing co-reactant that is more thermally reactive such as methane (CH$_4$) or ethane (C$_2$H$_6$). The carbon content of the thin metal film 250 may be decreased by choosing a co-reactant that is less thermally reactive. The reactivity of the less thermally reactive carbon-containing co-reactants may be increased by including plasma species such as H* and N* with the carbon-containing co-reactants within the reaction chamber. The plasma may activate the less reactive carbon-containing co-reactants to make them more reactive with the surface of the substrate on which the thin metal film 250 is being formed. Alternately, the carbon content of the thin metal film 250 may be controlled by the application of a plasma to the thin metal film 250 in the absence of carbon-containing precursors may remove carbon from the film.

In another embodiment, two precursors with different reduction and adsorption energies may be pulsed into the chamber (with or without a reducing pulse in-between) to control the carbon content within the film and to modify the number of adsorption sites. In a particular example of this embodiment, a precursor geared towards MCx formation as the bottom layer of the thin metal film 250 and a precursor geared towards M formation as the top or surface layer of the thin metal film 250 may be used. Through the use of these two types of precursors the film may be designed to have barrier layer properties near the bottom and adhesion layer properties near the top of the layer. The higher concentration of metal at the top of the layer may serve as an adhesion layer or seed layer for any subsequent metal deposition depending on the type of metal used.

Post-deposition processes may be used tailor the properties of the thin metal film 250. For example, a post deposition process may be used to segregate the metals within an alloyed thin metal film 250, to form a concentration gradient of the metals within the alloyed thin metal film 250, to stuff grain boundaries of the film with carbon, or to incorporate a light element such as carbon or nitrogen. An energy induced process, such as a thermal anneal, may be used to segregate the metals within the film or to form a concentration gradient of the metals within the film due to the different solubilities of the different metals within the alloy or due to the precipitation of a metal. An energy induced anneal in combination with a surface reactive gas may be used to incorporate light elements such as carbon or nitrogen into the film by diffusion. A differential laser anneal may be used to heat small areas of the film to cause grain growth, precipitation, or segregation of a particular area of the film. Selective etching or ion milling may be used to thin the top layer of metal or to thin specific portions of the thin metal film 250.

In one particular embodiment, a tantalum carbide (TaC) film may be formed by the chemical phase deposition of the organometallic precursor TaCp$_2$H$_3$ with H$_2$ as a co-reactant at a temperature of between 300° C. and 400° C. The chemical phase deposition may be chemical vapor deposition (CVD) or atomic layer deposition (ALD). The deposition of this TaC film may be performed with or without an H$_2$ plasma. In this embodiment, the organometallic precursor and the co-reactant pulse durations may be set to be between 2 and 20 seconds with a nitrogen (N$_2$) inert-gas purge of equivalent duration.

In another particular embodiment, a thin metal film 250 of ruthenium and carbon may be formed as a barrier layer over vias 240 having aspect ratios of approximately 2:1 and 5:1 (height to width). The barrier layer is conformally deposited by the atomic layer deposition of the single metal center compound $Ru(C_7H_9)_2$ as the organometallic precursor. In this embodiment, alternating pulses of $Ru(C_7H_9)_2$ and hydrogen ($H_2$) are used to form the thin metal film 250. The temperature of the substrate during the pulses may be in the approximate range of 100° C. and 400° C. using plasma-assisted ALD. The thin metal film 250 may be formed to a thickness of approximately 50 Å and the amount of carbon incorporated into the film may be approximately 20%. A post-deposition thermal anneal that heats the thin film to the approximate temperature in the approximate range of 200° C. and 400° C. may be applied to the film to stuff the grain boundaries of the film with the carbon and to increase the amorphous nature of the film which in turn increases the barrier properties of the film.

In yet another particular embodiment, a thin metal film 250 of TiMo alloy having a Ti to Mo metal ratio in the approximate range of 0.5:1 and 1:1 may be formed as a barrier layer over visa 240 having aspect ratios of approximately 2:1 and 5:1 (height to width). The barrier layer is conformally deposited by atomic layer deposition (ALD) of the dual-metal center compound $TiMo(CO)_3(Cp)_3$ as the organometallic precursor. In this embodiment, alternating pulses of $TiMo(CO)_3(Cp)_3$ and hydrogen ($H_2$) are used to form the thin metal film 250. The pulse times for the organometallic precursor, the co-reactant, and the purge duration times may be between 2 seconds and 20 seconds. The purge gas may be an inert gas such as argon (Ar.) In addition, a plasma optionally is added to the deposition system, where either or both precursor and hydrogen plasma can be used for deposition. Furthermore, a single metal center precursor of Ti, such as $TiCl_2Cp_2$ may be used as another pulse after the co-reactant pulse to modify the Ti content of the films or to obtain a laminate with the desired composition. The temperature of the substrate during the pulses may be in the approximate range of 100° C. and 400° C. The thin metal film 250 may be formed to a thickness of approximately 50 Å. A post-deposition thermal anneal that heats the thin film to the approximate temperature of 200° C. to 400° C. may be applied to the film to completely alloy and mix the metals or conversely (in cases where the two metals have little solubility in each other) to segregate one metal preferably to the interface(s).

A metal layer 260 is then deposited into the vias 240. The metal layer may be copper, copper alloy (alloy metals include but are not limited to Al, Au, Ag, Sn, Mg), gold, tungsten, or silver. In one particular embodiment copper is deposited to form the metal layer 260. Copper may be deposited by electroplating or electroless (catalytic) deposition that require first depositing a seed material in the vias 240. FIG. 2k illustrates the structure that results after filling vias 240 with a conductive material. Although the embodiment illustrated in FIG. 2k illustrates only one dielectric layer 210 and vias 240, the process described above may be repeated to form additional conductive and insulating layers until the integrated circuit is produced.

Once the integrated circuit is complete the wafer on which the interconnect layers has been formed is cut into dice. Each die is then packaged individually. In one exemplary embodiment the die has copper bumps that are aligned with the package solder bumps on the pads of the package substrate and coupled to one another by heat. Once cooled, the package solder bumps become attached to the die solder bumps. The gap between the die and the package substrate may be filled with an underfill material. A thermal interface material and a heat sink may then formed over the die to complete the package.

Several embodiments have thus been described. However, those of ordinary skill in the art will recognize that the embodiments are not, but can be practiced with modification and alteration within the scope and spirit of the appended claims that follow.

We claim:

1. A method of forming a film for an interconnect, comprising:
   providing a chemical phase deposition organometallic precursor comprising multiple metal centers within a chemical phase deposition chamber; and
   depositing a metal film onto a substrate with the chemical phase deposition organometallic precursor by a chemical phase deposition process.

2. The method of claim 1, wherein the chemical phase deposition process is selected from the group consisting of chemical vapor deposition, atomic layer deposition, and hybrid CVD/ALD.

3. The method of claim 2, wherein the atomic layer deposition comprises pulsing a first organometallic precursor in a first pulse, pulsing a co-reactant in a second pulse after the first pulse, and pulsing a second organometallic precursor in a third pulse after the second pulse.

4. The method of claim 2, wherein the atomic layer deposition comprises pulsing a first organometallic precursor and a second organometallic precursor concurrently during a first pulse and pulsing a co-reactant in a second pulse after the first pulse.

5. The method of claim 1, wherein depositing the metal film onto the substrate with the organometallic precursor by the chemical phase deposition process comprises depositing the organometallic precursor at a temperature of less than approximately 400° C.

6. A method of forming an interconnect, comprising:
   forming an opening within a dielectric layer; and
   depositing a thin metal film within the opening by a chemical phase deposition process utilizing an organometallic precursor comprising a metal and a ligand.

7. The method of claim 6, wherein depositing the thin metal film within a trench comprises forming a barrier layer, a seed layer, or an adhesion layer.

8. The method of claim 6, wherein depositing the thin metal film within a trench comprises depositing a film having a thickness of less than 50 Å.

9. The method of claim 6, wherein the metal has seed layer properties and is selected from the group consisting of Cu, Ru, Pd, Pt, Ir, and Ni.

10. The method of claim 6, wherein the metal has barrier layer properties and is selected from the group consisting of Ta, Ti, Re, Mo, W, Zr, Hf, and Co.

11. The method of claim 6, wherein the ligand is selected from the group consisting of hydrogen, an alkyl, an allyl, an aryl, a silyl, a carbonyl, a polycyclic aryl, an amine, an alkoxide, a siloxyl, a phosphine, a polycyclic, or a heteronuclear polycyclic.

12. The method of claim 6, wherein the thin metal film is a concentration gradient of at least two different metals.

13. A method of forming an interconnect, comprising:
   forming an opening within a dielectric layer;
   depositing a thin metal film within the opening by a chemical phase deposition process utilizing an organometallic precursor and incorporating carbon into the thin metal film.

14. A method of forming an interconnect, comprising:
forming an opening within a dielectric layer;
depositing a thin metal film within the opening by a chemical phase deposition process utilizing an organometallic precursor; and
further comprising a post-deposition process, wherein the post-deposition process segregates metals within the thin metal film or diffuses a light element atom within the thin metal film.

15. A method of forming a barrier layer, comprising:
forming an opening within a dielectric layer formed over a substrate, the opening having an aspect ratio in the approximate range of 2:1 and 5:1 height to width; and
depositing a tantalum carbide film by atomic layer deposition utilizing an organometallic precursor comprising $TaCp_2H_3$ and a co-reactant comprising hydrogen.

16. The method of claim 15, wherein the substrate has a temperature in the approximate range of 300° C. and 400° C. while deposition the tantalum carbide film.

17. The method of claim 15, further comprising applying a plasma while depositing the tantalum carbide film.

* * * * *